July 24, 1956 H. SNYDER 2,756,335

FREQUENCY CONTROL CIRCUIT

Filed April 7, 1955

United States Patent Office 2,756,335
Patented July 24, 1956

2,756,335

FREQUENCY CONTROL CIRCUIT

Herman Snyder, Paterson, N. J.

Application April 7, 1955, Serial No. 499,864
4 Claims. (Cl. 250—36)

This invention relates to a method for controlling the frequency of an oscillator by electronic means.

The method of varying the frequency of an oscillator which to date has enjoyed greatest use is that which employs a so-called reactance modulator tube. In this method, the reactance modulator tube furnishes a reactive current to an oscillating tank circuit comprised of inductance and capacitance. This reactive current changes the effective inductance or capacitance in the tank circuit, thereby causing a change in frequency. The reactive current may be changed or varied by means of a voltage applied to the grid of the reactance modulator tube.

In view of the fact that an oscillating tank circuit has large circulating currents which increase wih an increase in the Q of the circuit, the reactive current supplied by the reactance modulator tube must be high to provide for large changes in frequency. This involves tubes of appreciable power handling ability, together with control voltages of appreciable magnitude. Furthermore, this type of system is susceptible to changes in plate voltage, an undesirable condition where the mean oscillator frequency must be closely controlled.

It is an object of this invention, therefore, to provide a method of frequency control which requires a minimum of power and current handling ability on the part of the equipment utilized.

Another object of this invention is to provide circuitry which requires minimum magnitude of control voltages for proper operation.

It is still a further object of this invention to provide means for varying the frequency of an oscillator over an extremely wide range.

And finally, this invention provides for extreme stability of oscillator frequency with changes in plate voltage.

For a better understanding of the invention together with other and further objects thereof, reference is had to the following description taken in connection with the accompanying drawings.

Figure 1:
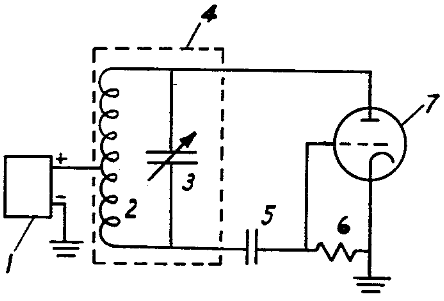
Figure 2:
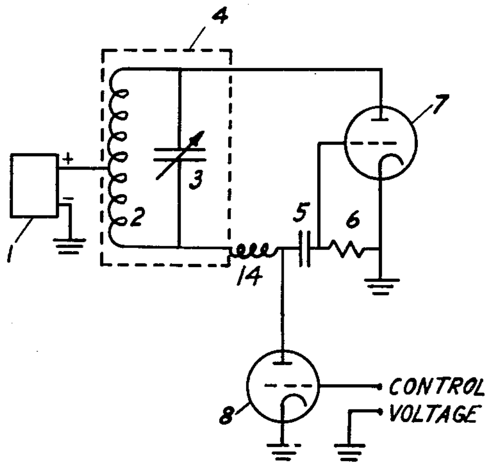
Figure 3:
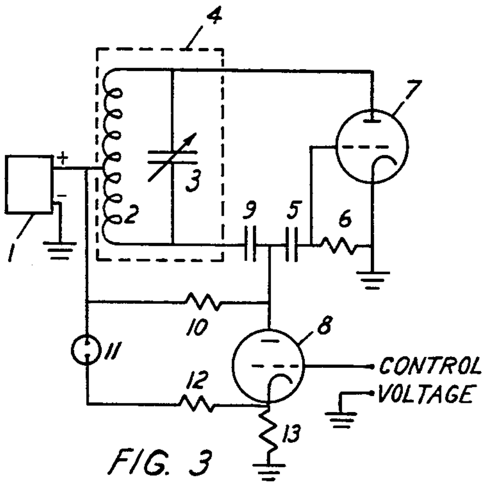
Figure 4:
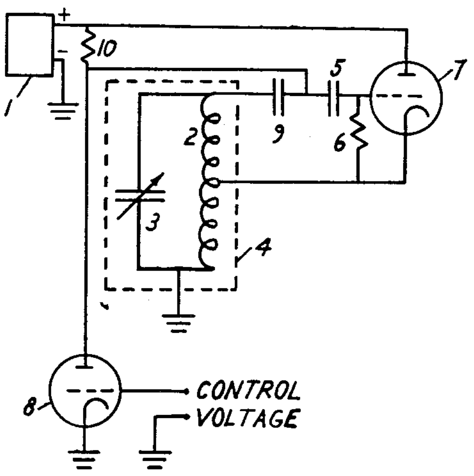

Referring to the drawings, Fig. 1 shows a representative oscillator circuit of the Hartley type comprised of tank circuit 4 which includes capacitance 3 and inductance 2; tube 7; bypass and blocking capacitor 5; and grid leak 6. The power supply is shown as 1. Fig. 2 shows how my invention may be applied to provide frequency control of this oscillator. Fig. 3 shows how frequency stabilization with respect to plate supply voltage changes may be accomplished. Though shown specifically for the oscillator circuit of Fig. 1, my invention is applicable to a wide variety of oscillators. Fig. 4, for example, shows a variation of Fig. 2 that may be preferable for certain circuit applications.

To explain my invention, let us first consider the normal LC type of oscillator. The objective in normal LC type oscillators is to provide feedback to the tank circuit in such phase as to sustain oscillation therein. Generally, the tank circuit presents a resistive load at the frequency of operation to the feedback circuit.

If, however, the tank circuit is driven by a voltage which is not quite in phase with the voltage normally across the resonant tank circuit, the frequency of oscillation will be changed. Consequently, if the phase of the driving voltage is controlled by means of proper circuitry, a new means of frequency control becomes possible, with all of the advantages indicated previously.

In order to understand how this is accomplished, reference should be made to Fig. 2. It can be seen that the following new elements over those indicated in Fig. 1 have been added: tube 8, the plate circuit of which acts as a resistance, this resistance being controllable in value by a voltage applied to the grid of said tube; and inductor 14, which together with the plate circuit of tube 8, comprises an RL phase shifting network.

Operation of this circuitry to provide electronic frequency control is accomplished as follows:

Since inductor 14 and tube 8 constitute an RL network, the resistance of which can be varied by changing the voltage on the grid of tube 8, the phase of the voltage appearing between plate and ground of tube 8 in general will be phase-shifted relative to the voltage appearing between the lower end of tank circuit 4 and ground. This phase-shifted voltage is applied to the grid of tube 7 and amplified, and is then fed back to tank circuit 4, causing the frequency of said tank circuit to depart from its normal value at resonance. In this fashion, a change in grid voltage of tube 8 causes a corresponding change in frequency of tank circuit 4.

Electronic phase shifting may be accomplished in various other ways in addition to that described above. For example, the inductor 14 in the RL network employed may be replaced by a capacitance of about the same reactance, such as capacitor 9 in Figs. 3 and 4, and results will be similar, except that frequency variation in the oscillator will be in a direction opposite to that obtained previously with a given change in grid voltage on tube 8. Resistor 10 shown in Figs. 3 and 4 is added to provide plate voltage to tube 8. Various other methods of obtaining phase shifts electronically are well known in the art, and can be utilized; however, the simplicity of the preferred RC or RL method described here of securing electronic phase shift control would make these other methods less attractive. In any case, any electronically phase-shifted voltage of the same frequency as the oscillator, no matter how obtained, will permit the desirable features of oscillator frequency control described above.

The method of frequency control may be applied to other type oscillators beside the Hartley, such as the Colpitts, and the tuned-plate tuned-grid types. All that is necessary is to provide a phase shifted voltage on the grid of the oscillator tube relative to the voltage across the LC combination in the plate circuit of the tube.

It should be pointed out that phase shifts must be kept under 90 degrees, or oscillation cannot be sustained. Even with this limitation, however, frequency changes of a high percentage of the basic frequency of the oscillator can be obtained electronically.

As shown, the voltage for controlling the frequency of the oscillator is applied to the grid of tube 8. This is not the only point that may be employed for the injection of control voltage. If a resistor is inserted in the cathode of tube 8, the frequency of the oscillator can also be controlled by applying a voltage to said cathode. However, variation of plate resistance is 180 degrees out of phase as when an identical A.-C. signal is applied to the grid.

In general, when the plate voltage on the oscillator changes, its frequency tends to change. The electronic frequency control circuitry described previously is particularly advantageous in the maintenance of oscillator frequency stability in spite of plate voltage changes. All that is required to attain this stability is to apply a proper proportion of the plate voltage change to the electronic phase control tube in such fashion as to tend to change the frequency in a direction opposite to that caused by the plate voltage change acting on the oscillator. In this fashion, the two changes are made to cancel each other out, and the frequency remains unchanged with plate voltage changes. It is desired to emphasize that stabilizing the frequency with respect to plate voltage variation in this manner does ot prevent electronic variation of frequency in accordance with any desired control voltage applied to the electronic phase shifting tube.

Fig. 3 indicates one method of frequency stabilization, in which the control voltage for cancelling out frequency changes in the oscillator due to plate voltage changes is applied to the cathode circuit of tube 8. The grid circuit here is free for application of the desired control voltages to vary the frequency in any desired fashion. It will be noted that the following elements have been added: gas tube 11, for subtracting a large constant voltage from the supply, but permitting changes in voltage to pass through unimpaired; current limiting resistor 12; and cathode resistor 13. Plate voltage changes appear across resistors 12 and 13. These resistors are so proportioned that the proper amount of control voltage appears across resistor 13, this control voltage varying the phase of the voltage on the grid of tube 7, and being just sufficient to neutralize any tendency of the oscillator to vary in frequency with changes in supply voltage.

While there have been described what at present are considered to be preferred embodiments of the invention, it will be understood by those skilled in the art that various changes and modifications may be made herein without departing from the invention, and it is, therefore, aimed in the appended claims to cover all such modifications and changes as fall within the spirit and scope of the invention.

I claim:

1. An electronically-controlled variable-frequency oscillator comprised of a tank circuit including capacitance and inductance, said tank circuit being adapted to supply a first voltage of suitable value; phase shifting means to which said first voltage is applied, including, in series, a capacitance and the resistance constituted by the plate circuit of an amplifier tube, at the plate of which a second voltage phase shifted with respect to the first becomes available, the phase shift of said second voltage being responsive to the value of a third control voltage acting between cathode and grid of said amplifier tube; and means responsive to said second voltage for maintaining said tank circuit in oscillation at a frequency determined in part by said third control voltage acting on said phase shifting means.

2. The claim set forth in claim 1 wherein the capacitance in said phase-shifting means is replaced by an inductance.

3. In an electronically-controlled variable-frequency oscillator including a tank circuit comprised of capacitance and inductance, and operated from an unregulated plate voltage supply, said tank circuit being adapted to supply a first voltage of suitable value: phase-shifting means to which said first voltage is applied including, in series, a capacitance and the resistance constituted by the plate circuit of an amplifier tube providing at its plate a second voltage phase-shifted with respect to the first, the phase shift of said second voltage being responsive to the value of a third control voltage acting between cathode and grid of said amplifier tube; means responsive to said second voltage for causing said tank circuit to oscillate at a frequency related to the phase shift of said second voltage; and means for securing said third control voltage from the said plate voltage supply in such manner and proportion as to cancel out changes in oscillator frequency due to changes in said plate voltage supply.

4. In an electronically-controlled variable-frequency oscillator including a tank circuit comprised of capacitance and inductance, and operated from an unregulated plate voltage supply, said tank circuit being adapted to supply a first voltage of suitable value: phase-shifting means to which said first voltage is applied including, in series, a capacitance and the resistance constituted by the plate circuit of an amplifier tube providing at its plate a second voltage phase-shifted with respect to the first, the phase shift of said second voltage being responsive to the value of a third control voltage acting between cathode and grid of said amplifier tube; means responsive to said second voltage for causing said tank circuit to oscillate at a frequency related to the phase shift of said second voltage; and means for securing said third control voltage, comprising a gas tube and resistor in series across said plate voltage supply, a suitable proportion of the voltage across said resistor being applied between grid and cathode of said amplifier tube, whereby changes in oscillator frequency due to changes in said plate voltage supply are cancelled out.

References Cited in the file of this patent

UNITED STATES PATENTS

| | | |
|---|---|---|
| 2,382,198 | Bollinger | Aug. 14, 1945 |
| 2,408,684 | Roberts | Oct. 1, 1946 |
| 2,716,218 | Arsem | Aug. 23, 1955 |